(12) United States Patent
Schwichtenhövel et al.

(10) Patent No.: US 10,700,391 B2
(45) Date of Patent: Jun. 30, 2020

(54) METHOD AND DEVICE FOR MONITORING A TEMPERATURE OF A BATTERY SYSTEM

(71) Applicant: Dr. Ing. h.c. F. Porsche Aktiengesellschaft, Stuttgart (DE)

(72) Inventors: Dominik Schwichtenhövel, Stuttgart (DE); Florian Kaumanns, Hürtgenwald (DE); Steffen Frei, Darmstadt (DE)

(73) Assignee: Dr. Ing. h.c.F. Porsche Aktiengesellschaft (DE)

( * ) Notice: Subject to any disclaimer, the term of this patent is extended or adjusted under 35 U.S.C. 154(b) by 320 days.

(21) Appl. No.: 15/889,680

(22) Filed: Feb. 6, 2018

(65) Prior Publication Data

US 2018/0233786 A1    Aug. 16, 2018

(30) Foreign Application Priority Data

Feb. 10, 2017 (DE) .................. 10 2017 102 668

(51) Int. Cl.

| | |
|---|---|
| *G01K 3/00* | (2006.01) |
| *H01M 10/42* | (2006.01) |
| *G01R 31/3832* | (2019.01) |
| *G01R 31/3835* | (2019.01) |
| *H01M 10/48* | (2006.01) |
| *G01K 13/00* | (2006.01) |
| *H01M 10/44* | (2006.01) |
| *G01R 19/165* | (2006.01) |

(Continued)

(52) U.S. Cl.
CPC ........ *H01M 10/4285* (2013.01); *G01K 13/00* (2013.01); *G01R 31/3832* (2019.01); *G01R 31/3835* (2019.01); *H01M 10/44* (2013.01); *H01M 10/48* (2013.01); *H01M 10/486* (2013.01); *G01R 19/16542* (2013.01); *G01R 31/3842* (2019.01); *H02J 7/0068* (2013.01)

(58) Field of Classification Search
None
See application file for complete search history.

(56) References Cited

U.S. PATENT DOCUMENTS

| | | | |
|---|---|---|---|
| 8,040,110 B2 * | 10/2011 | Al-Anbuky | ........... H02J 7/0078 |
| | | | 320/150 |
| 8,775,105 B2 | 7/2014 | Lin et al. | |
| 2015/0066406 A1 | 3/2015 | Sun et al. | |

FOREIGN PATENT DOCUMENTS

| | | |
|---|---|---|
| DE | 102011116779 A1 | 5/2012 |
| EP | 3015835 A1 | 5/2016 |

(Continued)

OTHER PUBLICATIONS

EPO Translation of JP2001-085071 (also published as JP4383597) (Year: 2001).*

(Continued)

*Primary Examiner* — Lisa M Caputo
*Assistant Examiner* — Nasir U. Ahmed
(74) *Attorney, Agent, or Firm* — RatnerPrestia (57) ABSTRACT

A device for monitoring a battery system and a method having the steps of determining information about a comparison profile for an incremental capacity of a battery cell of the battery system, determining information about a deviation of the comparison profile from a reference profile, and determining a temperature of the battery cell as a function of the information about the deviation.

16 Claims, 4 Drawing Sheets

(51) Int. Cl.
    *G01R 31/3842*     (2019.01)
    *H02J 7/00*     (2006.01)

(56) References Cited

FOREIGN PATENT DOCUMENTS

| | | |
|---|---|---|
| JP | 2001085071 A | 3/2001 |
| JP | 2016014588 A | 1/2016 |

OTHER PUBLICATIONS

EPO Translation of JP2016-14588 (Year: 2016).*
Korean Office Action for Korean Application No. 10-2018-0014960, dated Dec. 14, 2018, 7 pages.
German Search Report for German Application No. 10 2017 102 668.1, dated Sep. 8, 2017 with partial English translation, 6 Pages.
Japanese Notification of Reason of Rejection for Japanese Application No. 2018-021767, dated Sep. 11, 2018—8 pages.
Chinese Office Action for Chinese Application No. 201810110523X, dated Dec. 3, 2019, 6 pages.

* cited by examiner

METHOD AND DEVICE FOR MONITORING A TEMPERATURE OF A BATTERY SYSTEM

CROSS-REFERENCE TO RELATED APPLICATIONS

This application claims priority to German Patent Application No. DE 10 2017 102 668.1, filed Feb. 10, 2017, which is incorporated by reference herein in its entirety.

FIELD OF THE INVENTION

The invention relates to a method and to a device for monitoring a temperature of a battery system, in particular having a plurality of battery cells, during a discharging process or a charging process.

BACKGROUND OF THE INVENTION

In a battery system having a plurality of battery cells, the battery cells are thermally connected to one another via coupling layers. The battery cells which are described below are secondary battery cells, i.e. accumulator cells. For the safe operation of such battery systems the temperature of the individual battery cells is monitored. For this purpose, it is desirable to determine the temperature of the individual battery cells as accurately as possible. Owing to uneven temperature distribution, the temperature of individual battery cells in the battery system cannot be detected reliably for all the battery cells by means of a single temperature sensor. Unequal temperature distribution occurs not only at the module level but also at the cell level. Therefore, it is not possible to use conventional methods to determine the actual core temperature of the battery cell.

EP 3 015 835 A1, which is incorporated by reference herein, discloses a method for estimating the temperature of a battery cell, wherein the relationship between the internal resistance, the state of charge, the aging and the temperature of the battery cell is produced by means of a reference model of the battery cell. The temperature of the battery cell is determined by determining the actual internal resistance, by estimating the actual state of charge and by estimating the aging of the battery cell.

DE 10 2011 116 779 A1, which is incorporated by reference herein, describes a method for the sensorless estimation of the core temperature of a battery cell, wherein a core temperature of the battery cell is estimated by determining an internal resistance of the battery cell and by means of a function of the transmission of thermal energy of the battery cell.

SUMMARY OF THE INVENTION

Described herein is a method for determining information about a comparison profile for an incremental capacity of a battery cell of the battery system, determining information about a deviation of the comparison profile from a reference profile, and determining a temperature of the battery cell as a function of the information about the deviation. The estimation of a temperature profile in the battery system is therefore carried out in such a way that the temperature of the battery cell is estimated by analyzing the incremental capacity of the battery cells with respect to a reference profile in the charging process or discharging process.

The incremental capacity is a variable which is calculated from the derivative of the charge Q which has been input into or extracted from an accumulator cell with respect to its cell voltage V. It is therefore defined as:

$$ICA = dQ/dV$$

This variable has characteristic profiles and extreme values which are plotted against the cell voltage and are attributable to electrochemical processes in the accumulator cell. Robust indicators for the determination of cell properties can be determined from said characteristic profiles and extreme values. This method is referred to as an incremental capacity analysis (ICA analysis for short).

Determining the temperature preferably comprises assigning the information about the deviation to a predefined temperature value. This permits simple estimation of the temperature by mapping a specific deviation onto a unique predefined calibration data value. The predefined calibration data value specifies, for example, the difference between the temperature of the battery cell and a temperature measured at the reference battery cell. The reference battery cell is, for example, another battery cell of the same battery system, whose temperature is measured by means of a temperature sensor. In this case, the temperature of the battery cell is determined by correcting the measured temperature. It may also be appropriate to carry out, before the activation, a calibration for an individual cell and to consider the difference between the incremental capacity and this reference profile. As a result, fabrication tolerances and unequal initial profiles of the incremental capacity are compensated. The predefined calibration data value can also specify an absolute temperature of the battery cell charge. These absolute temperature values are determined in advance for a battery cell of identical design, for example in test bench trials. In this case, the temperature of the battery cell is determined by means of comparison to the calibration data value.

The method preferably comprises detecting information about a voltage profile of a battery cell, determining information about a time derivative of the voltage profile, and determining information about the comparison profile as a function of the information about the time derivative of the voltage profile. This is a first possible way of determining the profile of the incremental capacity.

The method preferably comprises detecting information about a current profile of a battery cell, determining information about a cell charge in the battery cell through integration of the current profile over time, and determining information about the comparison profile as a function of a derivative of the cell charge with respect to the voltage. This is a second possible way of determining the profile of the incremental capacity.

The method preferably comprises detecting information about a reference voltage profile at the reference battery cell, determining information about a reference time derivative of the reference voltage profile, and determining the information about the reference voltage profile as a function of the information about the time derivative of the reference voltage profile, wherein the detection of information about the voltage profile at the battery cell and the detection of information about the reference voltage profile of the reference battery cell are carried out at least partially in a chronologically overlapping fashion with a charging process or discharging process of the battery system. As a result, the reference profile is determined during the monitoring of the battery system.

The method preferably comprises detecting information about a reference current profile of a reference battery cell, determining information about a cell charge through integration of the reference current profile over time, and determining the information about the reference profile as a function of a derivative of the cell charge with respect to the voltage, wherein the detection of information about the current profile of the battery cell and the voltage profile and detection of information about the reference current profile and the reference voltage profile of the reference battery cell are carried out at least partially in a chronologically overlapping fashion with a charging process or discharging process of the battery system.

Preferably, a temperature of the reference battery cell is detected at least once during the detection of information about the reference voltage profile at the reference battery cell, and the temperature of the battery cell is determined as a function of the temperature of the reference battery cell and the predefined temperature value.

The method preferably comprises measuring the temperature at a battery cell and determining a multiplicity of temperatures for a multiplicity of battery cells of the battery system. The monitoring or estimation of the temperature profile in the battery system is therefore carried out in such a way that the temperature of a battery cell, in particular of a single battery cell, is measured by means of the temperature sensor, and on the basis thereof the temperatures of the other battery cells of the battery system are estimated by analyzing the incremental capacity of the individual battery cells in the charging or discharging process.

The Information about the reference profile is preferably an, in particular, cell-specific, statically predefined profile. Test bench trials can be used to determine the predefined reference profile. A temperature sensor for detecting the temperature of the reference battery cell can then be dispensed with.

With respect to the device, this problem is solved by a computing apparatus, designed to determine information about the comparison profile for an incremental capacity of a battery cell of the battery system, to determine information about the deviation of the comparison profile from a reference profile, and to determine a temperature of the battery cell as a function of the information about the deviation.

A memory is preferably provided for storing predefined temperature values, wherein the determination of the temperature comprises assigning the information about the deviation to one of the predefined temperature values.

The device preferably comprises a detection apparatus, designed to detect information about a voltage profile of a battery cell, wherein the computing apparatus is designed to determine information about a time derivative of the voltage profile, and to determine information about the comparison profile as a function of the information about the time derivative of the voltage profile.

The device preferably comprises a detection apparatus, designed to detect information about a current profile of a battery cell, wherein the computing apparatus is designed to determine information about a charge in the battery cell through integration of the current profile over time, and to determine information about the comparison profile as a function of a derivative of the charge in respect to the voltage.

The detection apparatus is preferably designed to detect information about a reference voltage profile of a reference battery cell, wherein the computing apparatus is designed to determine information about a reference time derivative of the reference voltage profile and the information about the reference voltage profile as a function of the information about the time derivative of the reference voltage profile, wherein the detection of information about the voltage profile of the battery cell and the detection of information about the reference voltage profile of the reference battery cell are carried out at least partially in a chronologically overlapping fashion with a charging process or discharging process of the battery system.

The detection apparatus is preferably designed to detect information about a reference current profile of a reference battery cell, wherein the computing apparatus is designed to determine information about a cell charge through integration of the reference current profile over time, and to determine the information about the reference current profile as a function of a derivative of the charge according to the voltage, wherein the detection of information about the current profile at the battery cell and the detection of information about the reference current profile of the reference battery cell are carried out at least partially in a chronologically overlapping fashion with a charging process or discharging process of the battery system.

A temperature sensor is preferably provided for detecting the temperature of the reference battery cell, wherein a temperature detection apparatus is designed to detect the temperature at least once during the detection of information about the reference voltage profile at the reference battery cell, and wherein the computing apparatus is designed to determine the temperature of the battery cell as a function of the temperature of the reference battery cell and the predefined temperature value.

The temperature detection apparatus is preferably designed to measure the temperature of a battery cell, wherein the computing apparatus is designed to determine a multiplicity of temperatures for a multiplicity of battery cells of the battery system. The monitoring or estimation of the temperature profile in the battery system are therefore carried out in such a way that the temperature of a battery cell, in particular of a single battery cell, is measured by means of the temperature sensor, and on the basis thereof the temperatures of the other battery cells of the battery system are estimated by analyzing the incremental capacity of the individual battery cells in the charging or discharging process.

A further memory is preferably provided for storing the information about the reference profile as an, in particular, cell-specific, statically predefined profile. Test bench trials can be used to determine the predefined reference profile. The temperature sensor for detecting the temperature of the reference battery cell can then be dispensed with. A further possible way is to analyze the deviation of the incremental capacity compared to a calibration profile for each individual cell. There is then no provision of an assignment of ICA information to absolute temperature values or temperature differences but rather provision of an assignment of relative ICA information to relative or absolute temperature values or temperature differences.

BRIEF DESCRIPTION OF THE DRAWINGS

Further features and advantages of the invention can be found in the dependent claims, the description and the drawing. In the drawing:

DETAILED DESCRIPTION OF THE INVENTION

In the figures, identical reference symbols relate to identical, similar or functionally identical components.

Figure 1:
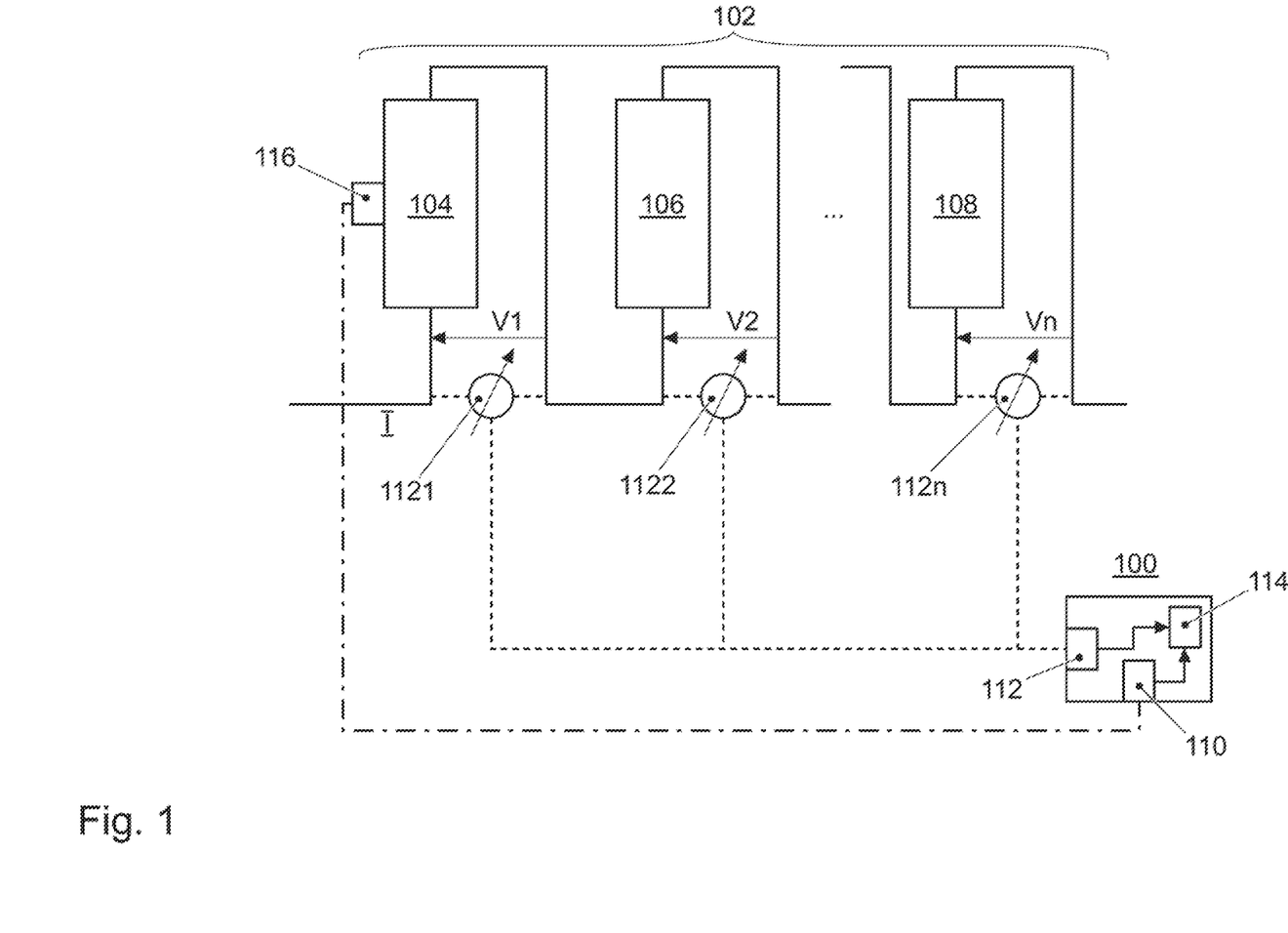
FIG. 1 is a schematic view of part of a battery system.

FIG. 1 shows a schematic view of a device 100 for monitoring a battery system 102 with at least two battery cells 104, 106, ..., 108, which are connected in series. A plurality of these series circuits can also be connected in parallel. The battery cells 104, 106, ..., 108 are to be charged with an instantaneous current I, or discharged. The battery cell 104 is also referred to below as a reference battery cell 104. The reference battery cell 104 can 10o also be another of the battery cells 104, 106, ..., 108.

A temperature detection apparatus 110 and a detection apparatus 112 are connected to a computing apparatus 114 via data lines. The temperature detection apparatus 110 detects a temperature at the reference battery cell 104. For this purpose, a temperature sensor 116 is arranged at the reference battery cell 104. The connection between the temperature sensor 116 and temperature detection apparatus 110 is represented by a dot-dash line in FIG. 1.

The detection apparatus 112 is designed to detect, during the charging or discharging, information about voltages V1, ..., Vn at the battery cells 104, 106, ..., 108. For example, corresponding measuring circuits 1121, 1122, ..., 112n which are connected in parallel with the battery cells 104, 106, ..., 108, and are connected to the detection apparatus 112, are used for this purpose. The electrical connections for this are illustrated in FIG. 1 as dashed lines.

The detection apparatus 112 is designed to detect information about voltage profiles at the battery cells 106, ..., 108. The detection apparatus 112 is additionally designed to detect information about a reference voltage profile at the reference battery cell 104. The detection of information about the voltage profile at the battery cells 106, ..., 108 and the detection of information about the reference voltage profile at the reference battery cell 104 are carried out at least partially in a chronologically overlapping fashion with a charging process or discharging process of the battery system 102. The detection apparatus 112 can be designed to detect information about a reference current profile at a reference battery cell 104. For this purpose, the detection apparatus 112 is designed to measure the current I which flows to at least one of the battery cells 104, 106, ..., 108.

The computing apparatus 114 is designed to determine information about a time derivative of the voltage profile and to determine information about a reference time derivative of the reference voltage profile. In addition, the computing apparatus 114 is designed to determine information about a time reference derivative of the reference voltage profile. This is described below.

The computing apparatus 114 is designed to determine information about a comparison profile of a derivative of a charge in the battery cell 106, ..., 108 according to the voltage as a function of the information about the time derivative of the voltage profile. In addition, the computing apparatus 114 is designed to determine information about a reference profile. This is also described below.

The computing apparatus 114 can be designed to determine information about a charge through integration of the reference current profile over time, and to determine the information about the reference profile as a function of a derivative of the charge according to the voltage. The detection of information about the current profile at the battery cell 106, ..., 108 and the detection of information about the reference current profile at the reference battery cell 104 are preferably carried out at least partially in a chronologically overlapping fashion with a charging process or discharging process of the battery system 102.

The computing apparatus 114 is designed, as described below, to determine information about a deviation of the comparison profile from the reference profile.

The computing apparatus 114 is additionally designed to determine the temperature of the battery cell 106, ..., 108 as a function of the information about the deviation.

The device 100 comprises a memory for storing predefined temperature values. The predefined temperature values are, for example, correction values for the temperature measured at the reference battery cell 104. The computing apparatus 114 assigns the information about the deviation to one of the predefined temperature values and corrects the measured temperature in order to determine the temperature of the battery cell 106, ..., 108, for example by means of the correction value.

The temperature sensor 116 measures the temperature of the reference battery cell 104, for example, continuously, wherein the temperature detection apparatus 110 detects the temperature at least once during the detection of information about the reference voltage profile.

The temperature detection apparatus 110 is preferably designed to measure the temperature at a single battery cell. In this case, the computing apparatus 114 is designed to determine a multiplicity of temperatures for a multiplicity of battery cells 106, ..., 108 of the battery system 102. The monitoring or estimation of the temperature profile in the battery system 102 is therefore carried out in such a way that the temperature of a reference battery cell 104 is measured by means of the temperature sensor 116, and on the basis thereof the temperatures of the other battery cells 106, ..., 108 of the battery system 102 are estimated by analyzing the voltage profiles of the individual battery cells in the charging or discharging process.

Figure 2:
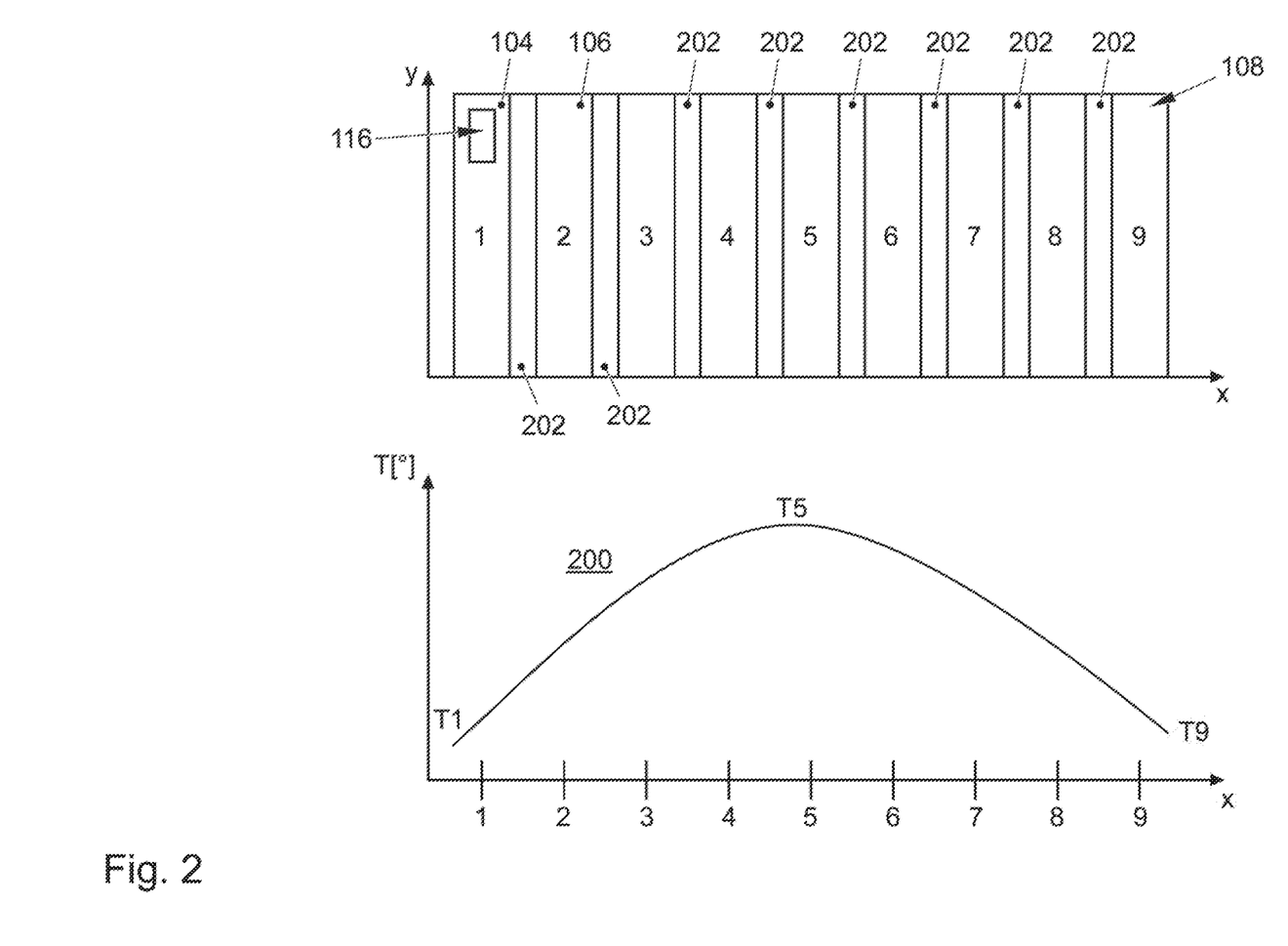
FIG. 2 is a schematic view of a battery system with nine battery cells and a spatial temperature distribution in the battery system in a longitudinal direction of the battery system.

A spatial temperature distribution 200 is illustrated in FIG. 2 for a battery system 102 which extends spatially in a longitudinal direction x with 9 cells 104, 106, ..., 108. The spatial arrangement of the battery cells in the longitudinal direction x and in the transverse direction y is illustrated in the upper part of FIG. 2. In the lower part of FIG. 2, the temperature distribution 200 is plotted over the longitudinal direction x. The temperature distribution 200 starts at a temperature T1 of the reference battery cell 104 which is detected by the temperature sensor 116. The temperature rises as the center of the battery system 102 is increasingly approached, up to a maximum temperature T5 and then drops to a temperature T9 as the distance from the center of the battery system 102 increases. The temperature profile 200 is illustrated for a battery system 102 which is constructed from a purely serial connection of individual cells. In this context, the battery cells 104, 106, ..., 108 in the upper part of FIG. 2 are numbered 1 to 9. Intermediate layers 202 are arranged between each of the battery cells 1 to 9. Said intermediate layers 202 bring about thermal coupling, with a high thermal conductivity. Assuming an ideal peripheral condition with respect to dissipation of heat, the temperature profile T is obtained. Accordingly, the two battery cells 104, 108 at the edge have the lowest temperatures, and the battery cells in the central position have the highest temperatures. The temperature sensor is arranged so as to measure the temperature T1 at the battery cell 104. An installation position of the temperature sensor 116 is variable and can be compensated by corresponding calibration.

Figure 3:
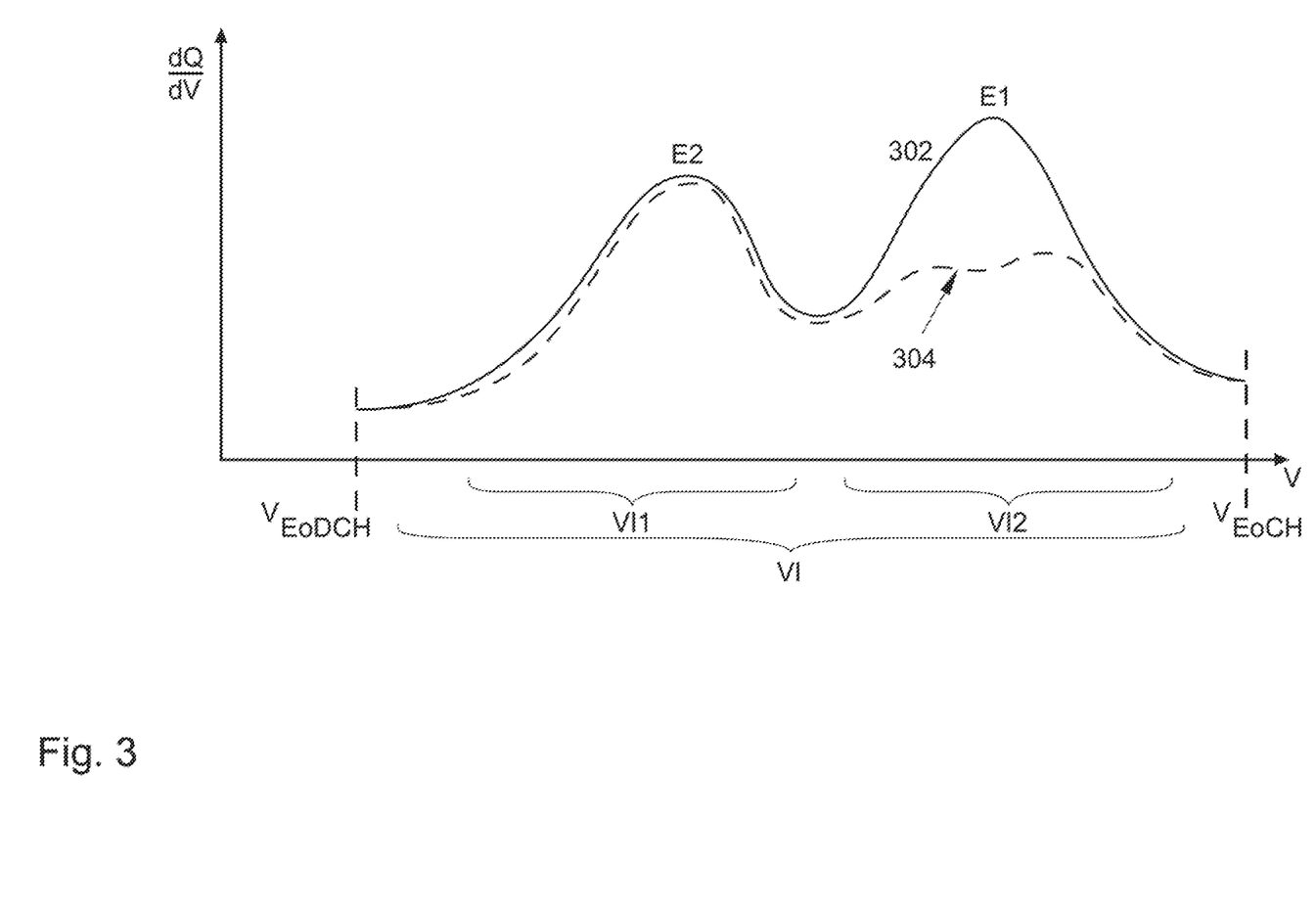
FIG. 3 is a schematic view of a profile of two derivatives of charges of two different battery cells according to the voltage, plotted against the voltage.

FIG. 3 is a schematic illustration of a profile of two derivations dQ/dV of charges Q of two different battery cells according to the voltage V, plotted against the voltage V of the respective battery cell. These derivations dQ/dV are referred to below as ICA curves.

ICA curves are based on incremental capacity analysis, ICA. The incremental capacity of a battery cell, in particular of a lithium-ion battery cell, during a charging or discharging process is represented with incremental capacity analysis. An ICA curve can be determined as a function of the derivation of the voltage curve, as follows:

$$dQ/dV = I(dV/dt)^{-1}.$$

Depending on the state of health of the battery cell, the cell temperature and the cell chemistry, the ICA curve has characteristic extreme points, which are also referred to below as maximum values. During processes of charging or discharging with instantaneous current I, said current is also known or can be detected. If the instantaneous voltage V is known, the ICA curve can be determined as a function of the derivation of the voltage curve for an instantaneous current I during the charging or discharging process with differentiation operations, for example statistical counting methods. The derivation dQ/dV of the charge Q of a battery cell according to the voltage V is therefore determined without integrating the current, in order to determine the charge.

In FIG. 3, curve 302 corresponds to the profile of the ICA curve of a battery cell at the edge of the battery system 102, and curve 304 corresponds to the profile of the ICA curve of a battery cell in a central installation position in the battery system 102. A typical ICA curve, i.e. a typical profile of the derivation dQ/dV, with a first extreme value E1 and a second extreme value E2, is illustrated. The first extreme value E1 occurs at a higher voltage of the battery cell than the second extreme value E2. For specific cell chemistry, it has been possible to prove experimentally that the first extreme value E1 decreases as the temperature of the battery cell increases. If the curve 302 is considered as a reference profile, and the curve 304 is considered as a comparison profile, different deviations of the comparison profile from the reference profile occur as a function of the temperature. With this knowledge and awareness of the precise temperature influence on the decrease of the first extreme value E1, the temperature measurement at any battery cell of the battery system 102 is sufficient to estimate the temperature at the other battery cells by means of analysis of the ICA curves. In this context, it is not necessary to know the entire ICA curve but rather only the region of the first extreme value E1. Therefore, partial charging or discharging events are, under certain circumstances, sufficient to estimate the temperature. Further influencing factors on the implementation of the first extreme value E1, such as, for example, the instantaneous current strength I or the state of health of the battery cell, are preferably compensated. Implementation of the first extreme value E1 means here not only its dQ/dV value but also the form or shape of the ICA curve in the surroundings of the first extreme value E1. A position of the extreme values with respect to one another and/or the different shape of the extreme values can be used as a measure of the deviation. Alternatively, the area which is enclosed by the between the two compared ICA curves, and which can be determined, for example, by integration, in a defined voltage interval can also be used.

FIG. 3 illustrates predefined voltage intervals VI, VI1, VI2 in which the ICA curve comprises both extreme values E1, E2 or only the first extreme value E1 or only the second extreme value E2. The predefined voltage intervals VI, VI1, VI2 are shorter than a voltage range between a first voltage VoDCH in a completely discharged battery cell and a second voltage VoCH in a completely charged battery cell.

Figure 4:
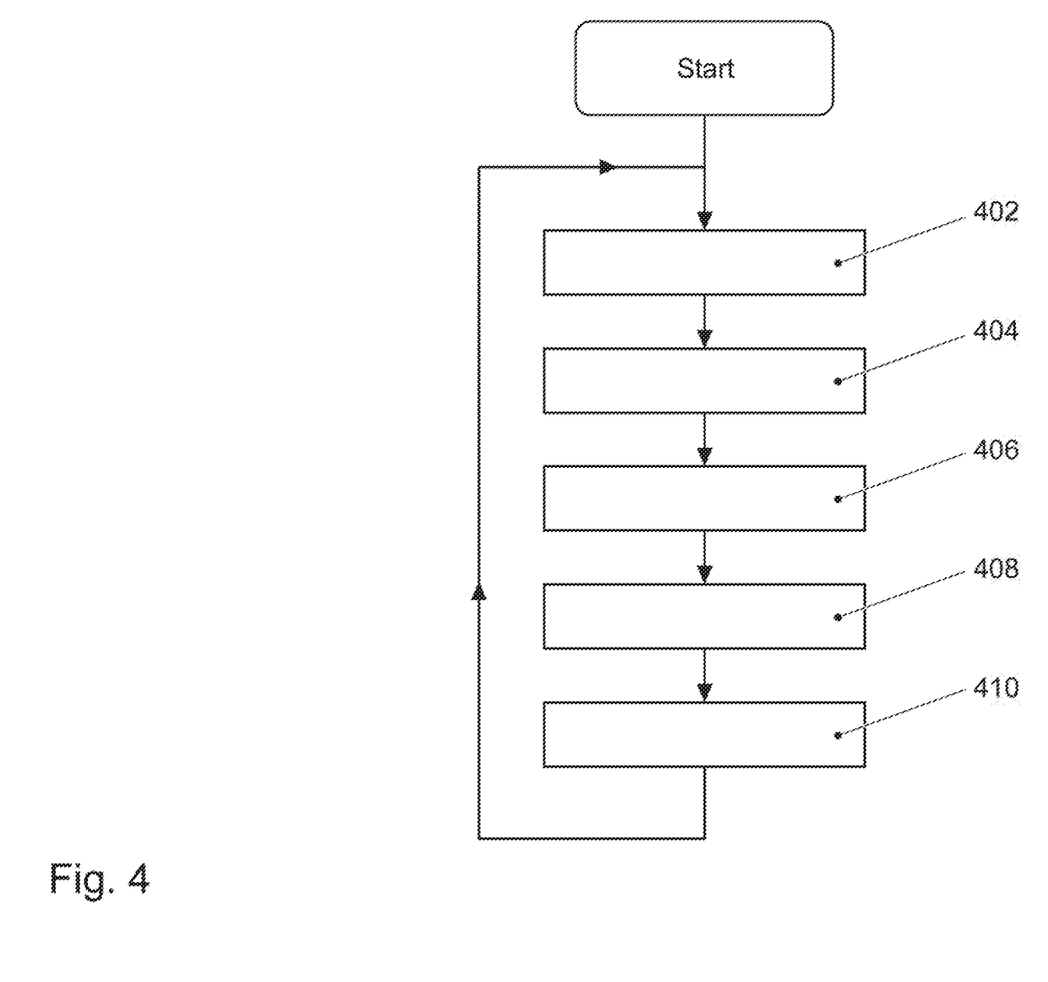
FIG. 4 is a schematic view of parts of a method for monitoring a battery system.

A method for monitoring the battery system 102 is described with reference to FIG. 4. The method preferably occurs during the charging process or discharging process at voltages between the first voltage VoDCH and the second voltage VoCH. Only voltages in one of the voltage intervals VI, VI1, VI2 are preferably monitored.

After the start, in a step 402 information about the voltage profile V2, . . . , Vn at the battery cells 106, . . . , 108 is detected. Optionally, a reference voltage profile V1 at the reference battery cell 104 is detected. The detection of information about the voltage profile V2, . . . , Vn of the battery cell 106, . . . , 108 and the detection of information about the reference voltage profile V1 of the reference battery cell 104 are carried out at least partially in a chronologically overlapping fashion with a charging process or discharging process of the battery system. In addition, information about a current profile of the battery cells 106, 108 is detected. In addition there can be provision for information about the reference current profile at a reference battery cell 104 to be detected.

Subsequently, in a step 404 information about the time derivative of the voltage profile V1, V2, . . . , Vn is determined. Alternatively to this, information about the reference time derivative of the reference voltage profile V1 is determined. There can also be provision for information about the charge in the battery cell 106, 108 to be determined by integration of the current profile over time. In addition there can be provision for information about a charge to be determined by integration of the reference current profile over time.

Subsequently, in a step 406 information about the comparison profile is determined. Optionally, information about the reference profile is determined. The comparison profile is determined, for example, as a function of the information about the time derivative of the voltage profile V1, V2, . . . , Vn.

If appropriate, the information about the comparison profile is determined as a function of a derivative of the charge according to the voltage.

In addition there can be provision for information about the reference profile to be determined as a function of a derivative of the charge with respect to the voltage.

The detection of information about the current profile at the battery cell 106, . . . , 108 and the detection of information about the reference current profile at the reference battery cell 104 are preferably carried out at least partially in a chronologically overlapping fashion with a charging process or discharging process of the battery system 102.

Subsequently, in a step 408 information about the deviation of the comparison profile from the reference profile of the reference derivative of the reference charge in the reference battery cell according to the voltage is determined. For this purpose, the information about the reference profile is used as an, in particular, cell-specific, statistically predefined profile, or the alternatively determined information about the reference profile is used.

Subsequently, in a step 410 the temperature of the battery cell 104, 106, . . . , 108 is determined as a function of the information about the deviation. For this purpose, the information about the deviation is assigned to a predefined temperature value. Subsequently, the step 402 is executed.

There can be provision for the temperature at the reference battery cell 104 to be measured. In this case, the predefined temperature value is a correction value for the measured temperature. If the temperature is not measured, the predefined temperature value is an absolute temperature of the battery cell.

If a temperature measurement is provided, it is carried out at least once, for example, during the detection of information about the reference voltage profile of the reference battery cell 104. The method can provide for measuring of the temperature at the reference battery cell 104, and determining a multiplicity of temperatures for a multiplicity of battery cells 106, . . . , 108 of the battery system 102.

As an alternative to measuring the temperature, the temperature sensor 116 is dispensed with if sufficient calibration data is acquired in advance by means of test bench trials. Then, uniquely defined mapping occurs between the absolute or relative deviation and the temperature by means of the calibration data. The calibration data comprises, for example, information about the reference profile as an, in particular, cell-specific, statically predefined profile.

The device 100 comprises in this case a further memory for storing the information about the reference profile as an, in particular, cell-specific, statically predefined profile.

The monitoring or estimation of the temperature profile in the battery system therefore takes place in such a way that the temperature of a battery cell, in particular of a single battery cell, is measured by means of the temperature sensor, and on the basis thereof the temperatures of the other battery cells of the battery system are estimated by analyzing the incremental capacity of the individual battery cells in the charging or discharging process.

Generally, in terms of a different cell chemistry, the method is not restricted solely to considering the extreme points E1 or E2. The same procedure is possible for estimating the cell temperature on the basis of a change in the ICA curve relative to a reference curve, which change is recorded under defined conditions for a battery cell.

In both embodiments, the computing apparatus 114 can be designed to determine the deviation only in the predefined voltage interval VI, VI1, VI2.

What is claimed is:

1. A method for monitoring a battery system having multiple interconnected battery cells, said method comprising:
   determining information about a comparison profile for an incremental capacity of a battery cell of the battery system,
   determining information about a deviation of the comparison profile from a reference profile for an incremental capacity of a reference battery cell of the battery system, said reference battery cell differing from said battery cell of the battery system, and
   determining a temperature of the battery cell as a function of the information about the deviation.

2. The method as claimed in claim 1, wherein determining the temperature comprises assigning the information about the deviation to a predefined temperature value.

3. The method as claimed in claim 2, wherein a temperature of the reference battery cell is detected at least once during the detection of information about a reference voltage profile of the reference battery cell, and the temperature of the battery cell is determined as a function of the temperature of the reference battery cell and the predefined temperature value.

4. The method as claimed in claim 1, further comprising:
   detecting information about a voltage profile of the battery cell,
   determining information about a time derivative of the voltage profile, and
   determining information about the comparison profile as a function of the information about the time derivative of the voltage profile.

5. The method as claimed in claim 1, further comprising:
   detecting information about a current profile of the battery cell,
   determining information about a charge in the battery cell through integration of the current profile over time,
   determining information about the comparison profile as a function of a derivative of the charge with respect to a voltage at the battery cell.

6. The method as claimed in claim 1, further comprising:
   detecting information about a reference voltage profile of the reference battery cell,
   determining information about a time reference derivative of the reference voltage profile, and
   determining the information about the reference profile as a function of the information about the time derivative of the reference voltage profile,
   wherein the detection of information about the reference voltage profile of the battery cell and the detection of information about the reference voltage profile of the reference battery cell are carried out at least partially in a chronologically overlapping fashion with a charging process or discharging process of the battery system.

7. The method as claimed in claim 1 further comprising:
   detecting information about a reference current profile of the reference battery cell,
   determining information about a charge through integration of the reference current profile over time, and
   determining the information about the reference profile as a function of a derivative of the charge with respect to the voltage,
   wherein the detection of information about the current profile of the battery cell and the detection of information about the reference current profile of the reference battery cell are carried out at least partially in a chronologically overlapping fashion with a charging process or discharging process of the battery system.

8. The method as claimed in claim 1, wherein the information about the reference profile is a cell-specific, statically predefined profile.

9. A device for monitoring a battery system having multiple interconnected battery cells, said device comprising: a computing apparatus configured to (i) determine information about a comparison profile for an incremental capacity of a battery cell of the battery system, (ii) determine information about a deviation of the comparison profile from a reference profile for an incremental capacity of a reference battery cell of the battery system, said reference battery cell differing from said battery cell of the battery system, and (iii) determine a temperature of the battery cell as a function of the information about the deviation.

10. The device as claimed in claim 9 further comprising memory for storing predefined temperature values, wherein the determination of the temperature comprises assigning the information about the deviation to a predefined temperature value.

11. The device as claimed in claim 9 further comprising a detection apparatus configured to detect information about a voltage profile of the battery cell,
   wherein the computing apparatus is configured to determine information about a time derivative of the voltage profile, and to determine information about the comparison profile as a function of the information about the time derivative of the voltage profile.

12. The device as claimed in claim 9 further comprising a detection apparatus configured to detect information about a current profile of the battery cell,
wherein the computing apparatus is configured to determine information about a charge in the battery cell through integration of the current profile over time, and to determine information about the comparison profile as a function of a derivative of the charge with respect to a voltage.

13. The device as claimed in claim 9, wherein the detection apparatus is configured to detect information about a reference current profile of the reference battery cell,
wherein the computing apparatus is configured to determine information about a charge through integration of the reference current profile over time, and to determine the information about the reference profile as a function of a derivative of the charge with respect to a voltage,
wherein the detection of information about the current profile of the battery cell and the detection of information about the reference current profile of the reference battery cell are carried out at least partially in a chronologically overlapping fashion with a charging process or discharging process of the battery system.

14. The device as claimed in claim 9, wherein the detection apparatus is configured to detect information about a reference voltage profile of the reference battery cell,
wherein the computing apparatus is configured to determine information about a time reference derivative of the reference voltage profile and the information about the reference profile as a function of the information about the time derivative of the reference voltage profile,
wherein the detection of information about the voltage profile at the battery cell and the detection of information about the reference voltage profile at the reference battery cell are carried out at least partially in a chronologically overlapping fashion with a charging process or discharging process of the battery system.

15. The device as claimed in claim 14, further comprising:
a temperature sensor (for detecting a temperature of the reference battery cell,
a temperature detection apparatus configured to detect the temperature at least once during the detection of information about the reference voltage profile of the reference battery cell, and
wherein the computing apparatus is configured to determine the temperature of the battery cell as a function of the temperature of the reference battery cell and a predefined temperature value.

16. The device as claimed in claim 15, wherein the temperature detection apparatus is configured to measure the temperature at a battery cell,
wherein the computing apparatus is configured to determine a multiplicity of temperatures for a multiplicity of battery cells of the battery system.

* * * * *